(12) United States Patent
Hu et al.

(10) Patent No.: US 12,341,142 B2
(45) Date of Patent: Jun. 24, 2025

(54) ELECTRONIC DEVICE AND MANUFACTURING METHOD OF ELECTRONIC DEVICE

(71) Applicant: Innolux Corporation, Miao-Li County (TW)

(72) Inventors: Shun-Yuan Hu, Miao-Li County (TW); Chia-Chi Ho, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 407 days.

(21) Appl. No.: 17/876,508

(22) Filed: Jul. 28, 2022

(65) Prior Publication Data
US 2023/0052081 A1    Feb. 16, 2023

Related U.S. Application Data

(60) Provisional application No. 63/233,334, filed on Aug. 16, 2021.

(30) Foreign Application Priority Data

May 12, 2022   (CN) .......................... 202210513602.1

(51) Int. Cl.
  *H01L 21/683*   (2006.01)
  *H01L 23/00*    (2006.01)
  *H01L 25/16*    (2023.01)

(52) U.S. Cl.
  CPC ........ *H01L 25/167* (2013.01); *H01L 21/6835* (2013.01); *H01L 24/08* (2013.01);
  (Continued)

(58) Field of Classification Search
  CPC ... H01L 25/167; H01L 21/6835; H01L 24/08; H01L 24/16; H01L 2221/68368;
  (Continued)

(56) References Cited

U.S. PATENT DOCUMENTS 8,327,253 B2 * 12/2012 Han ..................... G06F 3/04842
                                                               715/240
9,142,532 B2    9/2015 Suga et al.
(Continued)

OTHER PUBLICATIONS

"Search Report of Europe Counterpart Application", issued on Jan. 30, 2023, p. 1-p. 8.
(Continued)

*Primary Examiner* — Vu A Vu
(74) *Attorney, Agent, or Firm* — JCIPRNET

(57) ABSTRACT

Disclosed are an electronic device and a manufacturing method of an electronic device. The manufacturing method includes the following. A first substrate is provided. The first substrate includes a plurality of chips. A second substrate is provided. A transfer process is performed to sequentially transfer a first chip and a second chip among the chips to the second substrate. The second chip is adjacent to the first chip. A first angle is between a first extension direction of a first side of the first chip and an extension direction of a first boundary of the second substrate. A second angle is between a second extension direction of a second side of the second chip and the extension direction of the first boundary of the second substrate. The first angle is different from the second angle.

14 Claims, 9 Drawing Sheets

(52) U.S. Cl.
CPC .... *H01L 24/16* (2013.01); *H01L 2221/68368* (2013.01); *H01L 2224/08145* (2013.01); *H01L 2224/16227* (2013.01)

(58) Field of Classification Search
CPC . H01L 2224/08145; H01L 2224/16227; H01L 21/561; H01L 23/04; H01L 2221/68363; H01L 21/6836; H01L 23/66; H01L 24/13; H01L 24/17; H01L 24/81; H01L 25/0655; H01L 25/16; H01L 33/0095; H01L 33/62; H01L 2223/6677; H01L 2224/08225; H01L 2224/131; H01L 2224/16237; H01L 2224/1703; H01L 2224/81424; H01L 2224/81447; H01L 2224/81466; H01L 2924/12041; H01L 2924/15192; H01L 2924/15321; H01L 2924/16195; H01L 2924/19041; H01L 2924/19042; H01L 2924/19043; H01L 2924/19105; H10K 59/129
USPC ........................................................ 257/686
See application file for complete search history.

(56) References Cited

U.S. PATENT DOCUMENTS

| | | | |
|---|---|---|---|
| 9,721,819 B2* | 8/2017 | Speer | H01L 21/681 |
| 10,516,084 B2* | 12/2019 | Sasaki | H01L 33/58 |
| 10,973,158 B2* | 4/2021 | Bilewicz | H05K 13/0815 |
| 11,302,562 B2* | 4/2022 | Wang | H01L 33/0095 |
| 11,469,132 B2* | 10/2022 | Kim | H01L 21/6835 |
| 11,972,968 B2* | 4/2024 | Zhang | H01L 24/742 |
| 2010/0186226 A1* | 7/2010 | Amirparviz | H01L 24/83 29/832 |
| 2013/0122610 A1* | 5/2013 | Chung | H01L 21/6838 156/379 |
| 2019/0006564 A1 | 1/2019 | Sasaki et al. | |

OTHER PUBLICATIONS

"Office Action of Taiwan Counterpart Application", issued on Jun. 7, 2023, p. 1-p. 4.

* cited by examiner

ELECTRONIC DEVICE AND MANUFACTURING METHOD OF ELECTRONIC DEVICE

CROSS-REFERENCE TO RELATED APPLICATION

This application claims the priority benefits of U.S. provisional application Ser. No. 63/233,334, filed on Aug. 16, 2021 and China application no. 202210513602.1, filed on May 12, 2022. The entirety of each of the above-mentioned patent applications is hereby incorporated by reference herein and made a part of this specification.

BACKGROUND

Technical Field

The disclosure relates to an electronic device and a manufacturing method of an electronic device. In particular, the disclosure relates to an electronic device and a manufacturing method of an electronic device that can meet diverse requirements of users.

Description of Related Art

Currently, since a transfer machine can only move in an X-Y plane, a temporary substrate with a release film (e.g., a blue film) and chips mounted thereon moves at a fixed angle. Thus, during transfer of the chips from the temporary substrate to a target substrate, the chips are only at a single angle on the target substrate. Accordingly, if users need to change the angle of the chips on the target substrate for appearance reliability or electrical requirements, major operation of first suspending the production line is required to change settings of the machine or the like, which is relatively costly.

SUMMARY

The disclosure is directed to an electronic device and a manufacturing method of an electronic device, in which extension directions of sides of a plurality of transferred chips can respectively form a plurality of different angles with an extension direction of a boundary of a substrate.

According to an embodiment of the disclosure, a manufacturing method of an electronic device includes the following. A first substrate is provided. The first substrate includes a plurality of chips. A second substrate is provided. A transfer process is performed to sequentially transfer a first chip and a second chip among the plurality of chips to the second substrate. The second chip is adjacent to the first chip. A first angle is between a first extension direction of a first side of the first chip and an extension direction of a first boundary of the second substrate. A second angle is between a second extension direction of a second side of the second chip and the extension direction of the first boundary of the second substrate. The first angle is different from the second angle.

According to an embodiment of the disclosure, an electronic device includes a substrate, a first chip, and a second chip. The first chip and the second chip are disposed on the substrate. The second chip is adjacent to the first chip. A first angle is between a first extension direction of a first side of the first chip and an extension direction of a first boundary of the second substrate. A second angle is between a second extension direction of a second side of the second chip and the extension direction of the first boundary of the second substrate. The first angle is different from the second angle.

Based on the foregoing, in the embodiments of the disclosure, different angles are between the extension directions of the sides of the first chip and the second chip and the extension direction of the boundary of the second substrate after the first chip and the second chip are sequentially transferred to the second substrate. Compared with the existing technology, in which only a single angle is between the transferred chips and the substrate, the manufacturing method of an electronic device of the disclosure can meet the diverse requirements of users.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
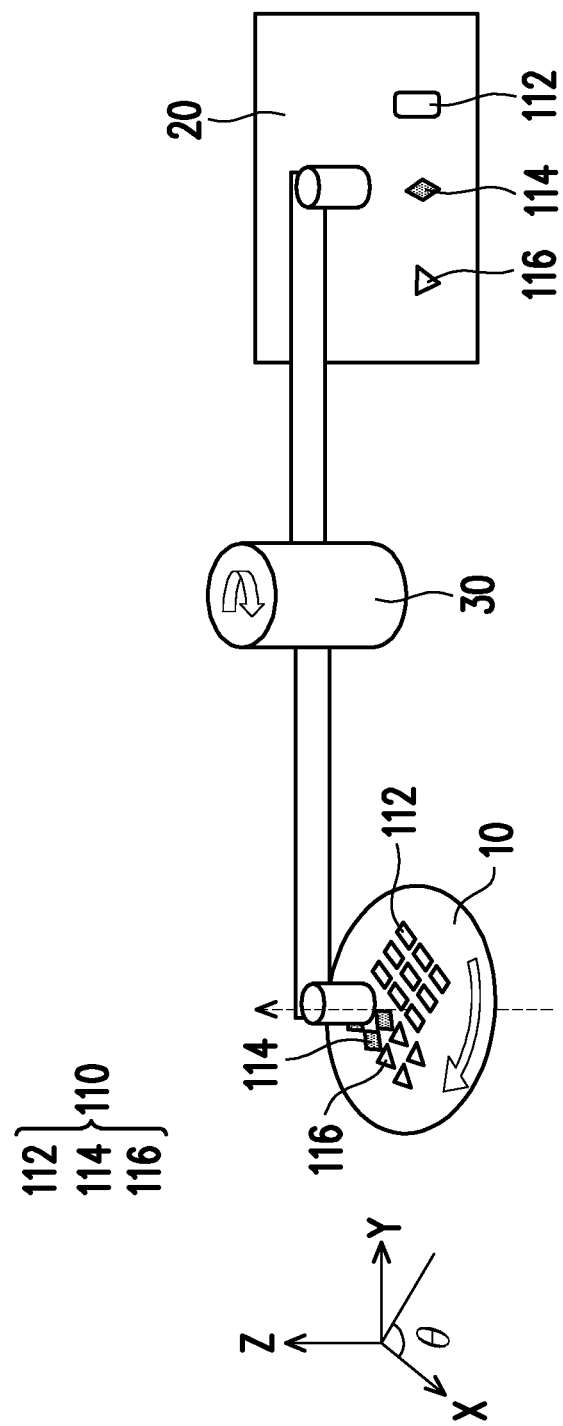
FIG. 1A is a schematic diagram of a manufacturing method of an electronic device according to an embodiment of the disclosure.

Reference will now be made in detail to exemplary embodiments of the disclosure, examples of which are illustrated in the accompanying drawings. Wherever possible, the same reference numerals are used in the drawings and description to refer to the same or like parts.

The disclosure may be understood with reference to the following detailed description together with the accompanying drawings. It should be noted that, for ease of understanding by readers and conciseness of the drawings, a plurality of drawings in the disclosure merely show a part of an electronic device, and specific elements in the drawings are not drawn to scale. In addition, the number and size of the elements in the drawings only serve for exemplifying instead of limiting the scope of the disclosure.

Certain terms are used throughout the description and the appended claims to refer to specific elements. Those skilled in the art should understand that electronic device manufacturers may refer to the same element by different names. Herein, it is not intended to distinguish between elements that have the same function but have different names.

In the following description and claims, terms such as "include", "comprise", and "have" are open-ended terms, and thus should be interpreted as "including, but not limited to".

In addition, relative terms, such as "below" or "bottom" and "above" or "top," may be used in the embodiments to describe the relative relationship of one element to another element of the drawings. It will be understandable that if the device in the drawings is turned upside down, elements described on the "lower" side will become elements described on the "upper" side.

In some embodiments of the disclosure, terms related to bonding and connection such as "connection", "interconnection", etc., unless specifically defined, may indicate the case where two structures are in direct contact, or where two structures are not in direct contact and other structures are disposed in between. Moreover, such terms related to bonding and connection may also cover the case where two structures are both movable or where two structures are both fixed. Furthermore, the term "coupling" includes transfer of energy between two structures by means of direct or indirect electrical connection, or transfer of energy between two separate structures by means of mutual induction.

It should be understood that when an element or film layer is referred to as being "on", or "connected to" another element or film layer, the element or film layer may be directly on or connected to the another element or film layer, or intervening elements or film layers may also be present in between (non-direct circumstances). In contrast, when an element or film layer is referred to as being "directly on" or "directly connected to" another element or film layer, no intervening elements or film layers are present in between.

The term "about", "equal to", "equivalent" or "same", "substantially", or "essentially" is typically interpreted so that a value is within 20% of a given value or range, or within 10%, 5%, 3%, 2%, 1%, or 0.5% of a given value or range.

As used herein, the term(s) "film" and/or "layer" may refer to any continuous or discontinuous structure and material (e.g., materials deposited by the methods disclosed herein). For example, films and/or layers may include two-dimensional materials, three-dimensional materials, nanoparticles, or even partial or complete molecular layers, or partial or complete atomic layers, or atomic and/or molecular clusters. The films or layers may include materials or layers having pinholes and may be at least partially continuous.

Although the terms first, second, third, and so on may be used to describe diverse constituent elements, such constituent elements are not limited by the terms. The terms are used only to discriminate one constituent element from other constituent elements in the description. In the claims, the terms first, second, third, etc. may be used in accordance with the order of claiming elements instead of using the same terms. Accordingly, a first constituent element in the following description may be a second constituent element in the claims.

Unless otherwise defined, all terms (including technical and scientific terms) used herein have the same meaning as commonly understood by one of ordinary skill in the art. It is understandable that these terms, such as those defined in commonly used dictionaries, should be interpreted to have a meaning consistent with the background or context of the related art and the disclosure, and not interpreted in an idealized or overly formal manner, unless specifically defined herein.

It should be noted that features in several different embodiments below may be replaced, recombined, mixed with each other to achieve other embodiments without departing from the spirit of the disclosure.

The electronic device of the disclosure may include, but is not limited to, a display device, an antenna device, a sensing device, a light-emitting device, or a tiled device. The electronic device may include a bendable or flexible electronic device. The electronic device may include electronic components. The electronic components may include passive elements, active elements, or a combination thereof, for example, a capacitor, a resistor, an inductor, a variable capacitor, a filter, a diode, a transistor, a sensor, MEMS, a liquid crystal chip, but not limited thereto. The diode may include a light-emitting diode (LED) or a non-light-emitting diode. The diode include a P-N junction diode, a PIN diode, or a constant current diode. The light-emitting diode may include an organic light-emitting diode (OLED), a mini LED, a micro LED, a quantum dot LED, fluorescence, phosphor, or other suitable materials or a combination thereof, for example but not limited thereto. The sensor may include a capacitive sensor, an optical sensor, an electromagnetic sensor, a fingerprint sensor (FPS), a touch sensor, an antenna, or a pen sensor, for example but not limited thereto. Hereinafter, a display device will be taken as the electronic device to describe the disclosure, but the disclosure is not limited thereto.

Reference will now be made in detail to exemplary embodiments of the disclosure, examples of which are illustrated in the accompanying drawings. Wherever possible, the same reference numerals are used in the drawings and description to refer to the same or like parts.

Figure 1B:
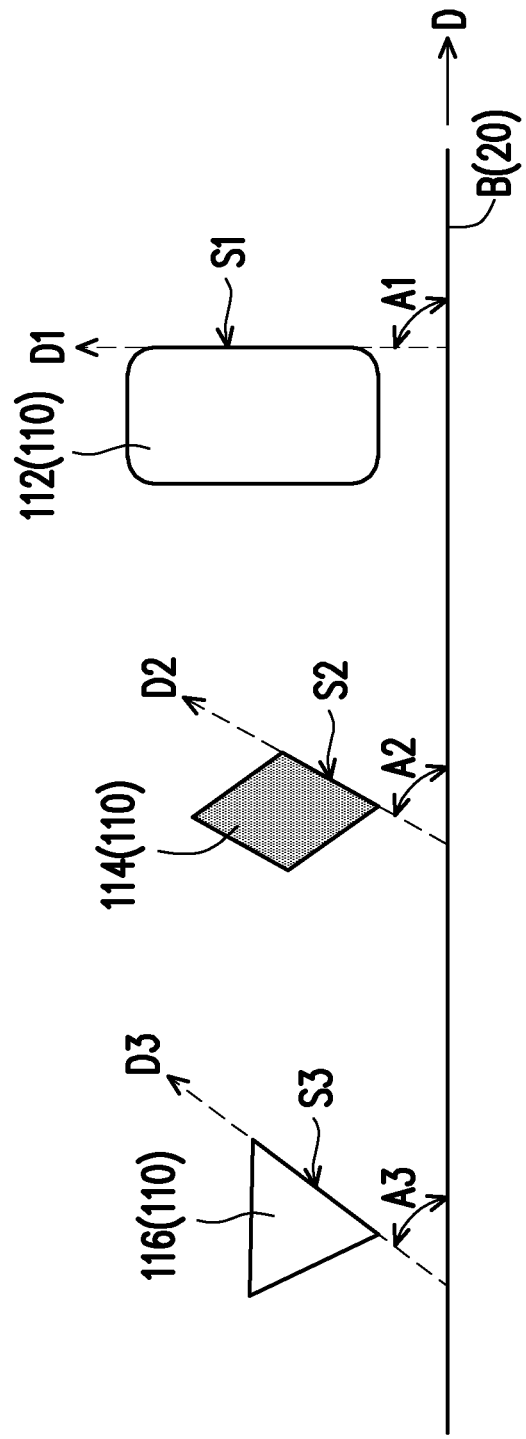
FIG. 1B is a schematic diagram of a first chip, a second chip, and a third chip on a second substrate in FIG. 1A.

FIG. 1A is a schematic diagram of a manufacturing method of an electronic device according to an embodiment of the disclosure. FIG. 1B is a schematic diagram of a first chip, a second chip, and a third chip on a second substrate in FIG. 1A.

First, reference may be made to FIG. 1A for the manufacturing method of an electronic device of this embodiment. First, a first substrate 10 including a plurality of chips 110 is provided. The first substrate 10 may be a wafer, a glass substrate, or a polyimide substrate (PI), for example but not limited thereto. In an embodiment, the first substrate 10 may be provided with a release film (e.g., a blue film) thereon. The release film is located between the first substrate 10 and the chips 110 to facilitate separation of the chips from the first substrate 10. Therefore, the first substrate 10 may be regarded as a temporary substrate. In an embodiment, the first substrate 10 may have a chamfer, an arc, or any other shape. The chips 110 may be packaged or bare, and may also be a capacitor, a resistor, an inductor, a variable capacitor, a filter, a diode, a transistor, a sensor, MEMS, a liquid crystal chip, for example but not limited thereto. The diode may include a light-emitting diode or a non-light-emitting diode. The diode include a P-N junction diode, a PIN diode, or a constant current diode. The light-emitting diode may include an organic light-emitting diode (OLED), a mini LED, a micro LED, a quantum dot LED, fluorescence, phosphor, or other suitable materials or a combination thereof, for example but not limited thereto. The sensor may include a capacitive sensor, an optical sensor, an electromagnetic sensor, a fingerprint sensor (FPS), a touch sensor, an antenna, or a pen sensor, for example but not limited thereto.

Next, with continued reference to FIG. 1A, a second substrate 20 and a pick-and-place device 30 are provided. The first substrate 10 and the second substrate 20 may be respectively located on opposite sides of the pick-and-place device 30, but not limited thereto. Here, for example, the first substrate 10 and the second substrate 20 are disposed on the X-Y plane, and the pick-and-place device 30 may move on the X-Y plane. The second substrate 20 may be a wafer, a glass substrate, or a polyimide substrate, for example but not limited thereto. In an embodiment, the second substrate 20 may have a chamfer, an arc, or any other shape.

After that, a transfer process is performed to sequentially transfer a first chip 112 and a second chip 114 among the chips 110 to the second substrate 20. The second chip 114 is adjacent to the first chip 112 on the second substrate 20. Therefore, the second substrate 20 may be regarded as a target substrate. The first chip 112 and the second chip 114 may be in the same shape or in different shapes. Here, the shape of the first chip 112 is a rectangle with rounded corners, and the shape of the second chip 114 is a rhombus, for example but not limited thereto. Here, the transfer process is rotating the first substrate 10, for example. In other words, the first substrate 10 is rotated relative to the X-axis, while the second substrate 20 remains stationary.

Further, with reference to FIG. 1A and FIG. 1B together, after the first substrate 10 including the chips 110 is rotated by an angle relative to the X-axis, the pick-and-place device 30 picks up the first chip 112 from the first substrate 10 and places the first chip 112 on the second substrate 20. Next, after the first substrate 10 is rotated by another angle relative to the X-axis, the pick-and-place device 30 picks up the second chip 114 from the first substrate 10 and places the second chip 114 adjacent to the first chip 112 on the second substrate 20. At this time, a first angle A1 is between a first extension direction D1 of a first side S1 (i.e., a long side) of the first chip 112 and an extension direction D of a first boundary B of the second substrate 20. In addition, a second angle A2 is between a second extension direction D2 of a second side S2 of the second chip 114 and the extension direction D of the first boundary B of the second substrate 20. In particular, the first angle A1 is different from the second angle A2. Here, for example, the first angle A1 is greater than 0 and less than or equal to 90 degrees, and the second angle A2 is greater than 0 and less than or equal to 90 degrees. A difference between the first angle A1 and the second angle A2 is less than 90 degrees, for example. In an embodiment, the difference between the first angle A1 and the second angle A2 is less than 45 degrees, for example. In another embodiment, the difference between the first angle A1 and the second angle A2 is less than 20 degrees, for example. Here, for example, the boundary B may be the long side of the substrate, and the sides may be the long sides of the chips. Alternatively, when side lengths of the chip are the same, the side adjacent to the long side of the substrate is taken as the reference, but not limited thereto.

Next, with reference to FIG. 1A and FIG. 1B together, the above-mentioned steps may also be repeated to further transfer a third chip 116 among the chips 110 to the second substrate 20. The third chip 116 is adjacent to the second chip 114, and the second chip 114 is located between the first chip 112 and the third chip 116, but not limited thereto. The shape of the third chip 116 is a triangle, for example but not limited thereto. A third angle A3 is between a third extension direction D3 of a third side S3 of the third chip 116 and the extension direction D of the first boundary B of the second substrate 20. In addition, the third angle A3 is different from the first angle A1 and the second angle A2. Here, the third angle A3 is greater than 0 and less than or equal to 90 degrees, for example. A difference between the first angle A1, the second angle A2, and the third angle A3 is less than 90 degrees, for example. In an embodiment, the difference between the first angle A1, the second angle A2, and the third angle A3 is less than 45 degrees, for example. In another embodiment, the difference between the first angle A1, the second angle A2, and the third angle A3 is less than 20 degrees, for example.

In brief, in this embodiment, the first chip 112, after the second chip 114, and the third chip 116 are sequentially transferred to the second substrate 20, the first angle A1, the second angle A2, and the third angle A3 of different angles are respectively between the extension direction D of the first boundary B of the second substrate 20 and the first extension direction D1 of the first side S1, the second extension direction D2 of the second side S2, and the third extension direction D3 of the third side S3. Compared with the existing technology, in which only a single angle is between the transferred chips and the substrate, the manufacturing method of an electronic device of the disclosure can meet the diverse requirements of users who need to change the angle of the chips on the target substrate for appearance reliability or electrical requirements.

It should be noted here that reference numerals and partial contents of the embodiments above remain to be used in the following embodiments, and the same reference numerals are used to refer to the same or like elements, and the description of the same technical content is omitted. Reference may be made to the embodiments above for the description of the omitted part, which will not be repeated in the following embodiments.

Figure 2:
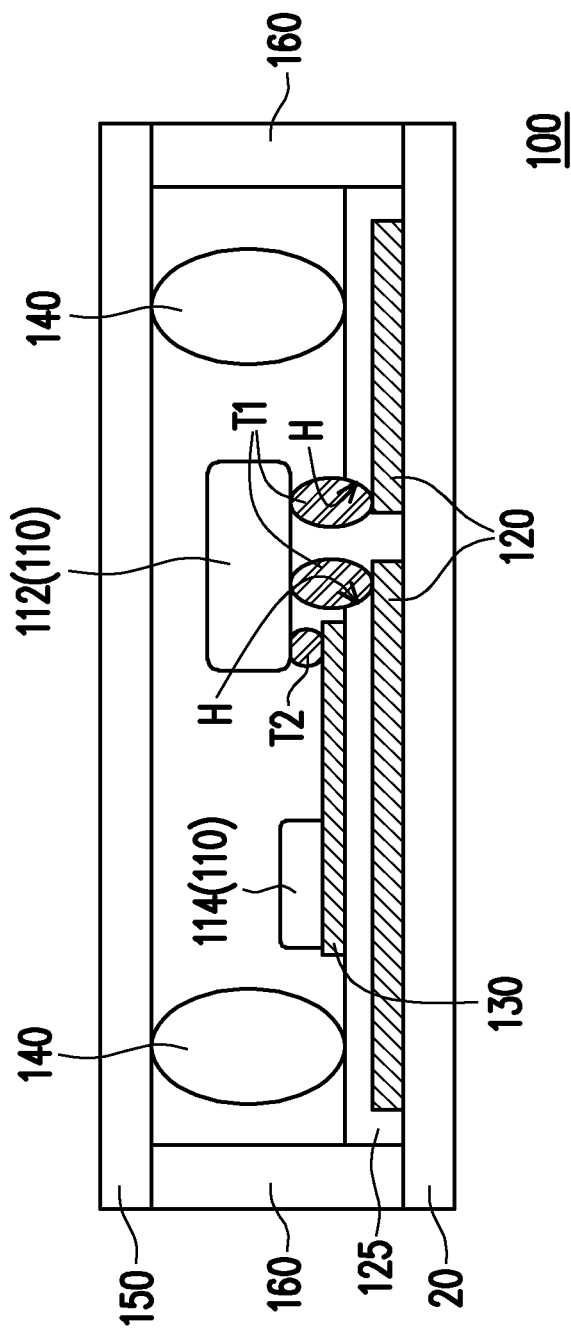
FIG. 2 is a schematic diagram of a manufacturing method of an electronic device according to another embodiment of the disclosure.

FIG. 2 is a schematic diagram of a manufacturing method of an electronic device according to another embodiment of the disclosure. With reference to FIG. 1A and FIG. 2 together, the manufacturing method of an electronic device of this embodiment is similar to the manufacturing method of an electronic device of FIG. 1A. The difference between them is that this embodiment also includes forming a metal layer 120 and an opening hole H after providing the second substrate 20 and before performing the transfer process. The metal layer 120 is located between the second substrate 20 and the first chip 112. An orthogonal projection of the first chip 112 on the second substrate 20 is overlapped with the opening hole H. Further, the metal layer 120 may be formed on the second substrate 20 and covered by a dielectric layer 125 having the opening hole H. The first chip 112 may be disposed in the opening hole H of the dielectric layer 125 and electrically connected to the metal layer 120 through a solder T1. Next, a pad 130 may be further between the second chip 114 and the metal layer 120. The first chip 112 may be electrically connected to the pad 130 through a solder T2, and the second chip 114 is directly disposed on the pad 130. Here, the first chip 112 is a light-emitting diode, and the second chip 114 is an active element, such as a thin film transistor, for example but not limited thereto. In addition, the metal layer 120 includes copper (Cu), titanium (Ti), or aluminum (A1), for example but not limited thereto.

Furthermore, a spacer 140 is formed on the dielectric layer 125. Next, a protective layer 150 is formed on the first chip 112 and the second chip 114 to protect the first chip 112 and the second chip 114. Disposing the spacer 140 maintains the distance between the protective layer 150 and the first chip 112 and the second chip 114. Finally, a sealing member 160 is between a periphery of the second substrate 20 and a periphery of the protective layer 150 to prevent moisture and oxygen from eroding the first chip 112, the second chip 114, the metal layer 120, and the pad 130. For example, the sealing member 160 is formed adjacent to the boundary of the second substrate 20. So far, an electronic device 100 is completed. Here, the electronic device 100 may include a display device, an antenna device, a sensing device, a light-emitting device, a packaging device, or a tiled device, but not limited thereto. According to another embodiment, it is also possible to first form the sealing member 160 on the periphery of the second substrate 20, and then form the protective layer 150 on the second substrate 20 and the spacer 140, but not limited thereto.

Figure 3:
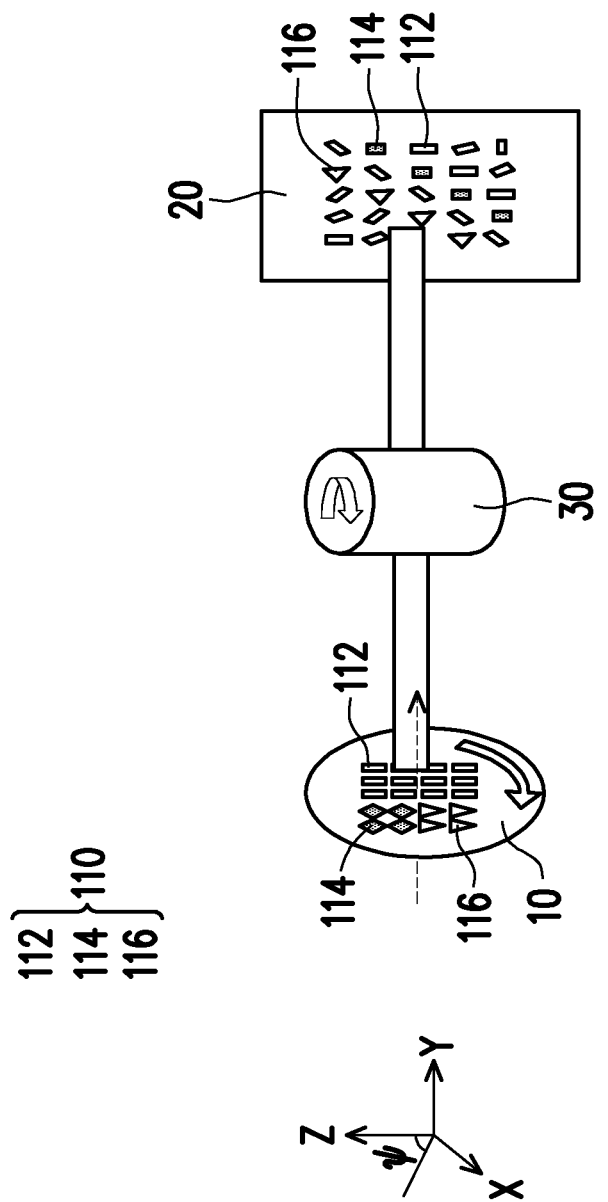
FIG. 3 is a schematic diagram of a manufacturing method of an electronic device according to another embodiment of the disclosure.

FIG. 3 is a schematic diagram of a manufacturing method of an electronic device according to another embodiment of the disclosure. With reference to FIG. 1A and FIG. 3 together, the manufacturing method of an electronic device of this embodiment is similar to the manufacturing method of an electronic device of FIG. 1A. The difference between them is that in this embodiment, the first substrate 10 and the second substrate 20 are disposed on the X-Z plane. In addition, the pick-and-place device 30 may move in the X-Z plane, and the transfer process is rotating the first substrate 10, for example. In other words, the first substrate 10 is rotated relative to the Z-axis, while the second substrate 20 remains stationary.

Figure 4:
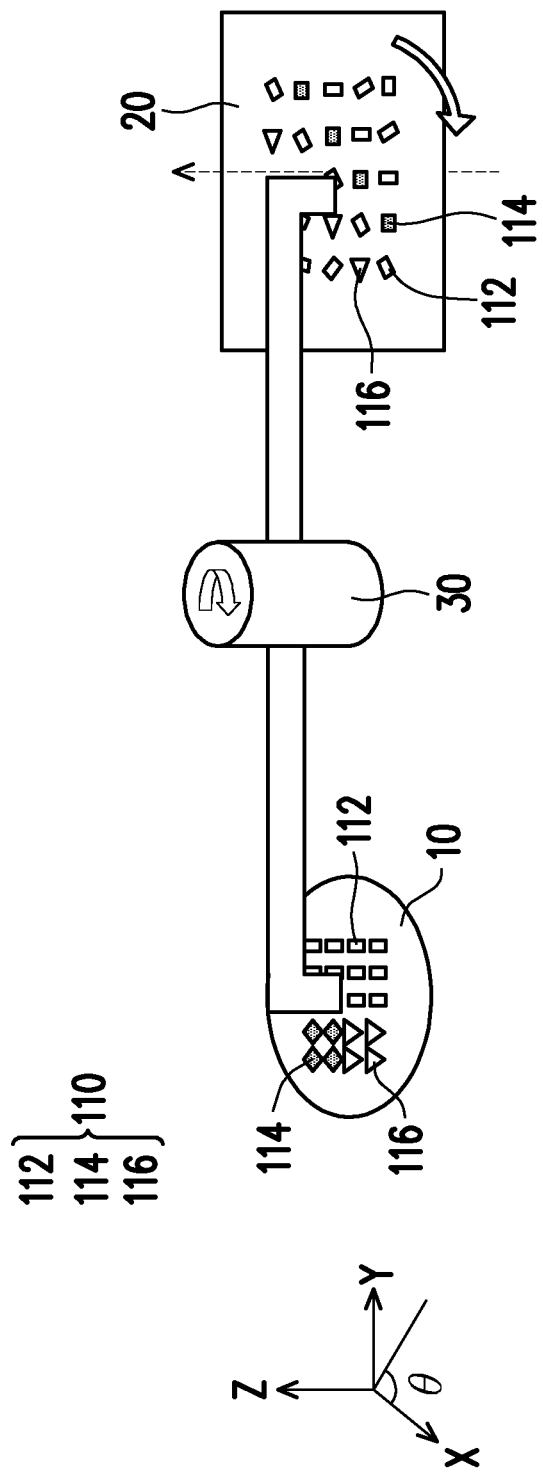
FIG. 4 is a schematic diagram of a manufacturing method of an electronic device according to another embodiment of the disclosure.

FIG. 4 is a schematic diagram of a manufacturing method of an electronic device according to another embodiment of the disclosure. With reference to FIG. 1A and FIG. 4 together, the manufacturing method of an electronic device of this embodiment is similar to the manufacturing method of an electronic device of FIG. 1A. The difference between them is that in this embodiment, the first substrate 10 and the second substrate 20 are disposed on the X-Y plane. In addition, the pick-and-place device 30 may move in the X-Y plane, and the transfer process is rotating the second substrate 20, for example. In other words, the second substrate 20 is rotated relative to the X-axis, while the first substrate 10 remains stationary.

Figure 5:
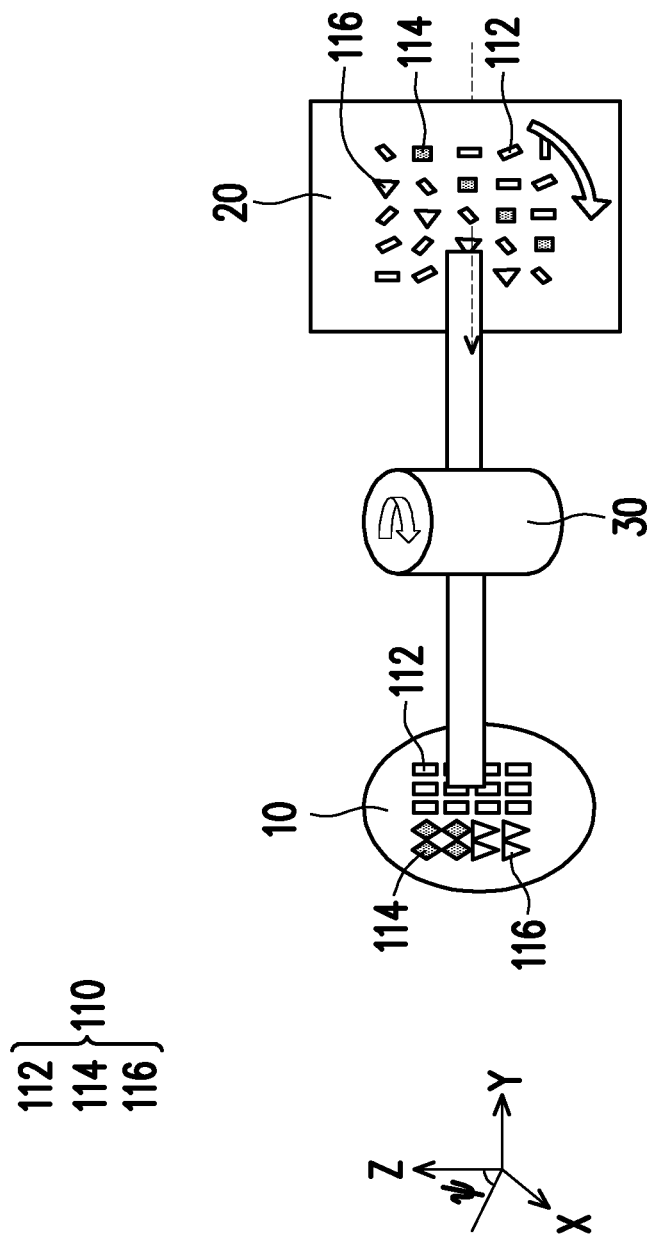
FIG. 5 is a schematic diagram of a manufacturing method of an electronic device according to another embodiment of the disclosure.

FIG. 5 is a schematic diagram of a manufacturing method of an electronic device according to another embodiment of the disclosure. With reference to FIG. 1A and FIG. 5 together, the manufacturing method of an electronic device of this embodiment is similar to the manufacturing method of an electronic device of FIG. 1A. The difference between them is that in this embodiment, the first substrate 10 and the second substrate 20 are disposed on the X-Z plane. In addition, the pick-and-place device 30 may move in the X-Z plane, and the transfer process is rotating the second substrate 20, for example. In other words, the second substrate 20 is rotated relative to the Z-axis, while the first substrate 10 remains stationary.

Figure 6:
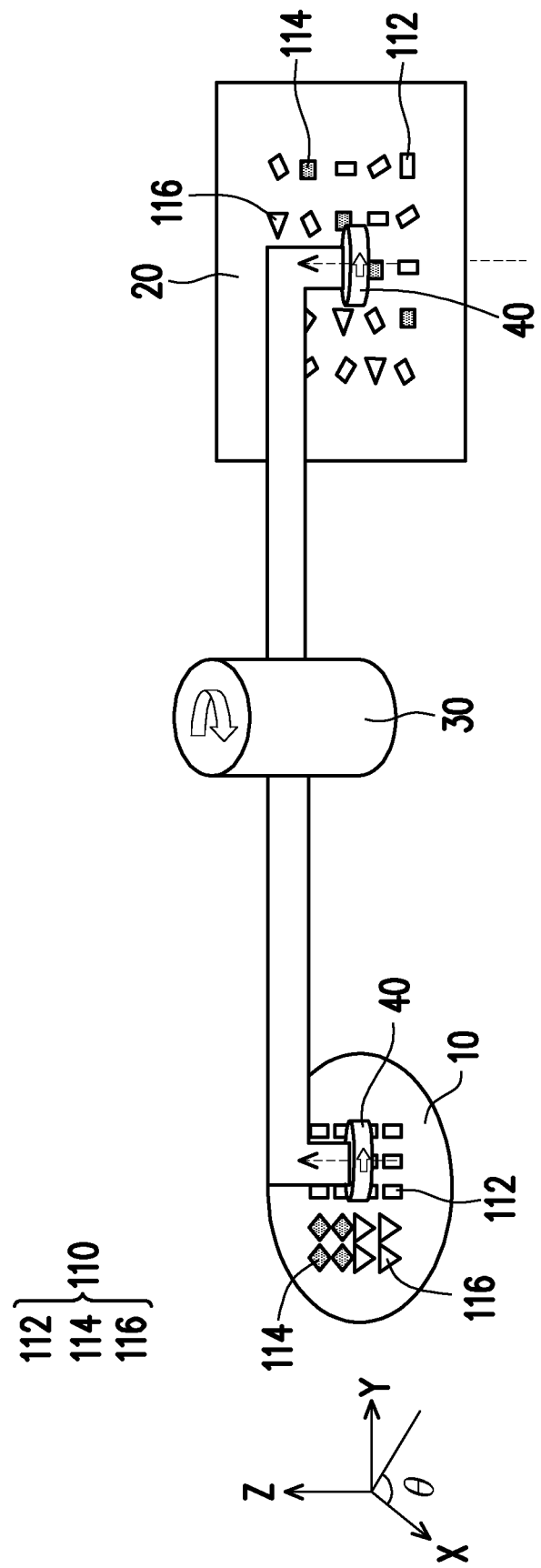
FIG. 6 is a schematic diagram of a manufacturing method of an electronic device according to another embodiment of the disclosure.

FIG. 6 is a schematic diagram of a manufacturing method of an electronic device according to another embodiment of the disclosure. With reference to FIG. 1A and FIG. 6 together, the manufacturing method of an electronic device of this embodiment is similar to the manufacturing method of an electronic device of FIG. 1A. The difference between them is that in this embodiment, the first substrate 10 and the second substrate 20 are disposed on the X-Y plane. In addition, the pick-and-place device 30 may be moved in the X-Y plane, and the transfer process includes rotating a rotary disk 40 disposed on the pick-and-place device 30, for example. In other words, the arrangement angles of the first chip 112, the second chip 114, and the third chip 116 after transferred to the second substrate 20 may be changed by rotating the rotary disk 40. In other words, the first substrate 10 and the second substrate 20 remain stationary during the transfer process.

Figure 7:
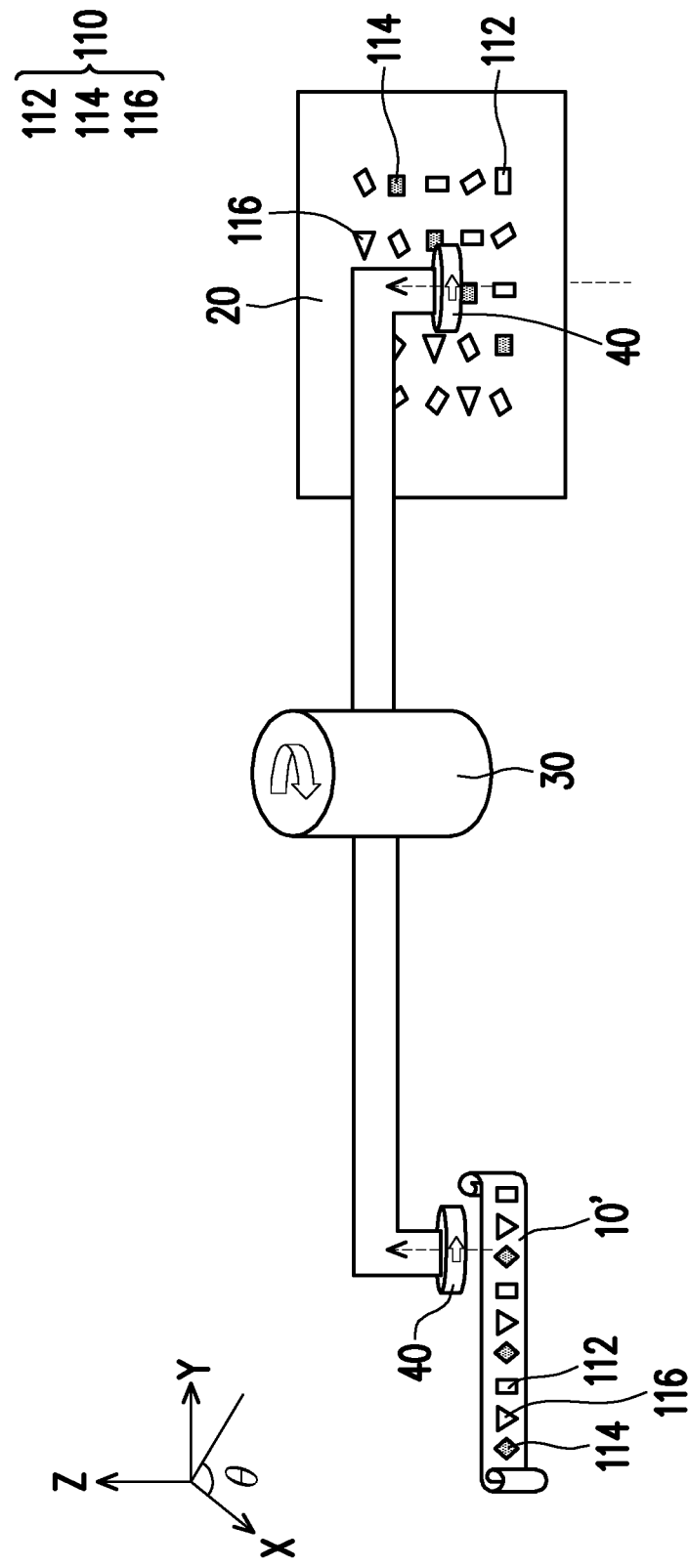
FIG. 7 is a schematic diagram of a manufacturing method of an electronic device according to another embodiment of the disclosure.

FIG. 7 is a schematic diagram of a manufacturing method of an electronic device according to another embodiment of the disclosure. With reference to FIG. 6 and FIG. 7 together, the manufacturing method of an electronic device of this embodiment is similar to the manufacturing method of an electronic device of FIG. 6. The difference between them is that a first substrate 10' of this embodiment and the first substrate 10 in FIG. 6 are in different structural forms. The first substrate 10' is embodied as a flexible substrate, such as a tape, but not limited thereto.

Figure 8:
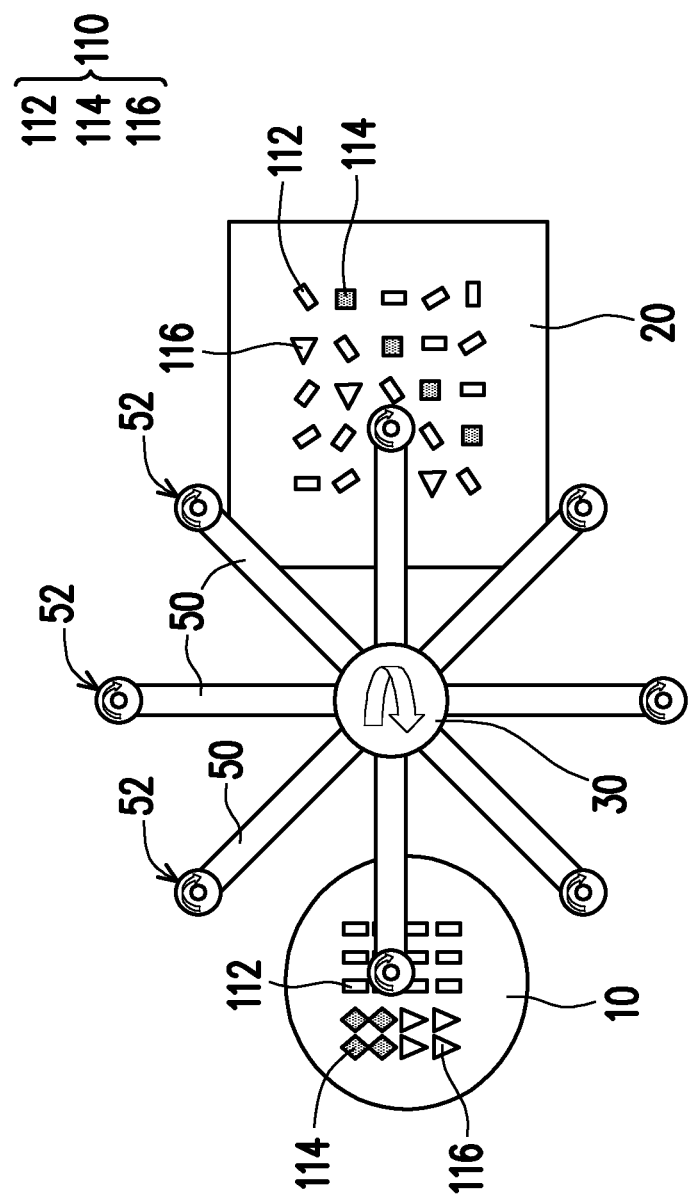
FIG. 8 is a schematic diagram of a manufacturing method of an electronic device according to another embodiment of the disclosure.

FIG. 8 is a schematic diagram of a manufacturing method of an electronic device according to another embodiment of the disclosure. With reference to FIG. 1A and FIG. 8 together, the manufacturing method of an electronic device of this embodiment is similar to the manufacturing method of an electronic device of FIG. 1A. The difference between them is that in this embodiment, the pick-and-place device 30 includes a plurality of robot arms 50 each having a rotary disk 52 at the front end. In addition, the transfer process includes rotating the rotary disk 52 of the robot arm 50. In an embodiment, for example, the arrangement angles of the first chip 112, the second chip 114, and the third chip 116 after transferred to the second substrate 20 may be changed by independently controlling the rotary disk 52 of each of the robot arms 50 to rotate the rotary disks 52 by different angles, which accelerates the pick-and-place process to reduce the manufacturing time.

In summary of the foregoing, in the embodiments of the disclosure, different angles are between the extension directions of the sides of the first chip and the second chip and the extension direction of the boundary of the second substrate after the first chip and the second chip are sequentially transferred to the second substrate. Compared with the existing technology, in which only a single angle is between the transferred chips and the substrate, the manufacturing method of an electronic device of the disclosure can meet the diverse requirements of users.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of an electronic device, comprising:
   providing a first substrate comprising a plurality of chips;
   providing a second substrate;
   performing a transfer process to sequentially transfer a first chip and a second chip among the plurality of chips to the second substrate, wherein the second chip is adjacent to the first chip, a first angle is between a first extension direction of a first side of the first chip and an extension direction of a first boundary of the second substrate, a second angle is between a second extension direction of a second side of the second chip and the extension direction of the first boundary of the second substrate, and the first angle is different from the second angle, wherein the transfer process comprises rotating the first substrate, rotating the second substrate, or rotating a rotary disk of a robot arm;
   forming a protective layer on the first chip and the second chip; and forming a sealing member between a periphery of the second substrate and a periphery of the protective layer.

2. The manufacturing method according to claim 1, further comprising:
transferring a third chip among the plurality of chips to the second substrate, wherein the third chip is adjacent to the second chip, a third angle is between a third extension direction of a third side of the third chip and the extension direction of the first boundary of the second substrate, and the third angle is different from the first angle and the second angle.

3. The manufacturing method according to claim 1, wherein a difference between the first angle and the second angle is less than 90 degrees.

4. The manufacturing method according to claim 1, wherein the transfer process comprises rotating a rotary disk.

5. The manufacturing method according to claim 1, further comprising:
forming a metal layer and an opening hole, wherein the metal layer is located between the second substrate and one of the first chip and the second chip, and an orthogonal projection of the one of the first chip and the second chip on the second substrate is overlapped with the opening hole.

6. The manufacturing method according to claim 5, further comprising:
forming a pad between the metal layer and the other one of the first chip and the second chip.

7. The manufacturing method according to claim 6, further comprising:
electrically connecting the one of the first chip and the second chip to the pad through a solder, and directly disposing the other one of the first chip and the second chip on the pad.

8. The manufacturing method according to claim 1, further comprising:
providing a release film, wherein the release film is located between the first substrate and the plurality of chips.

9. The manufacturing method according to claim 1, wherein the second substrate comprises a wafer, a glass substrate, or a polyimide substrate.

10. The manufacturing method according to claim 1, wherein the first chip and the second chip are in a same shape.

11. The manufacturing method according to claim 1, wherein the first chip and the second chip are in different shapes.

12. The manufacturing method according to claim 1, wherein a difference between the first angle and the second angle is less than 45 degrees.

13. The manufacturing method according to claim 1, wherein a difference between the first angle and the second angle is less than 20 degrees.

14. An electronic device, comprising:
a substrate;
a metal layer disposed on the substrate;
a dielectric layer disposed on the metal layer and having an opening hole;
a pad disposed on the dielectric layer;
a first chip and a second chip disposed on the substrate, wherein an orthogonal projection of the first chip on the substrate is overlapped with the opening hole, the first chip is electrically connected to the metal layer, and the second chip is directly disposed on the pad and electrically connected to the pad;
a protective layer disposed on the first chip and the second chip; and
a sealing member disposed between a periphery of the substrate and a periphery of the protective layer,
wherein the second chip is adjacent to the first chip, a first angle is between a first extension direction of a first side of the first chip and an extension direction of a first boundary of the substrate, a second angle is between a second extension direction of a second side of the second chip and the extension direction of the first boundary of the substrate, and the first angle is different from the second angle.

* * * * *